TEMPERATURE INDEPENDENT TRANSISTOR WITH GRAIN BOUNDARY

Filed Oct. 10, 1958 2 Sheets-Sheet 1

INVENTORS
HERBERT F. MATARÉ
BENJAMIN REED
OTTO WEINREICH
BY Theodore Jay Jr.
ATTORNEY

TEMPERATURE INDEPENDENT TRANSISTOR WITH GRAIN BOUNDARY

Filed Oct. 10, 1958 2 Sheets-Sheet 2

INVENTORS
HERBERT F. MATARÉ,
BENJAMIN REED
OTTO WEINREICH
BY

ATTORNEY

United States Patent Office 2,970,229

Patented Jan. 31, 1961

2,970,229

TEMPERATURE INDEPENDENT TRANSISTOR WITH GRAIN BOUNDARY

Herbert F. Mataré, Long Branch, N.J., Benjamin Reed, Flushing, N.Y., and Otto Weinreich, East Orange, N.J., assignors, by mesne assignments, to Sylvania Electric Products Inc., Wilmington, Del., a corporation of Delaware

Filed Oct. 10, 1958, Ser. No. 766,499

6 Claims. (Cl. 307—88.5)

Our invention relates to transistors.

In one type of transistor, known as the field effect transistor, a semiconductor layer of one conductivity type is sandwiched between two outer semiconductor layers of the opposite conductivity type, thus forming separate P–N junctions between each of the outer layers and the inner layer. Source and drain electrodes are secured to opposite ends of the inner layer. When the junctions are biased in the reverse direction, and a voltage of suitable polarity is applied between the source and drain electrodes, the majority carriers in the inner layer flow between the source and drain electrodes as an output current. Control signals applied to both junctions modulate the output current in accordance with the amplitude variations of the signals.

It is an object of the present invention to provide a new and improved field effect transistor.

Another object is to provide a new and improved field effect transistor which will operate over a wide range of temperatures extending, for example, from 4° to 300° Kelvin.

Still another object is to provide a new and improved field effect transistor incorporating a semiconductor bicrystal.

As is known to the art, a semiconductor bicrystal comprises two joined semiconductor crystals of one conductivity type having an extremely thin interface constituted by a grain boundary (which can be of different conductivity) common to both crystals.

In accordance with the principles of our invention, we provide a semiconductor bicrystal having a grain boundary which extends through said bicrystal between opposite ends thereof, the surface of the boundary being exposed at both ends. The crystal bulk is of one conductivity type; the boundary is of opposite conductivity type.

First and second rectifying connections are secured to corresponding ends of the bicrystal, each rectifying connection being in electrical contact both with the individual crystals and the grain boundary. (More particularly, each of the first and second connections make ohmic contact with the grain boundary and rectifying contact with the crystal bulk.) A third non-rectifying or ohmic connection is made to the surface of one of the crystals at a point intermediate the ends of the bicrystal. When desired, a fourth ohmic contact can be made to the surface of the other crystal at another point intermediate the ends of the bicrystal.

This device can be operated as a field effect transistor by biasing the first and second connections in the reverse direction with respect to the crystal bulk. Then, when a first constant voltage is applied between the first and second connections and a second variable voltage (either a direct or alternating voltage) is applied between the first connection and third connection (or third and fourth connections in parallel), the majority carriers in the grain boundary will flow in the grain boundary between the first and second connections, thus producing an output current. As the second voltage is varied, the output current is varied or modulated accordingly.

We have found that this transistor action will ensue over a temperature range which extends from room temperature (300° Kelvin) to the temperature of liquid helium.

Illustrative embodiments of our invention will now be described with reference to the accompanying drawings wherein.

Figure 1:
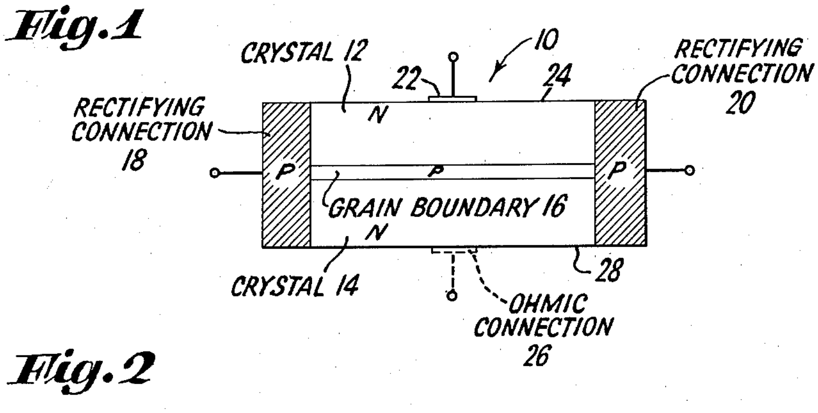
Fig. 1 shows a field effect transistor in accordance with our invention.

Referring now to Fig. 1, there is shown a field effect transistor comprising an integral semiconductor bicrystal 10 having first and second crystals 12 and 14 of one conductivity type and an extremely thin interface 16 therebetween constituted by a grain boundary region of opposite conductivity type common to both crystals.

First and second rectifying connections 18 and 20 are secured to the left hand and right hand ends respectively of the bicrystal, for example, in the form of alloy junctions. (It will be noted that connections 18 and 20 are rectifying with respect to the crystals but are ohmic with respect to the boundary 16.) A third non-rectifying or ohmic connection 22 is made to the exposed surface 24 of crystal 12. If desired, a fourth ohmic connection 26 (shown in dotted lines) can also be made to the exposed surface 28 of crystal 14.

Figure 2:
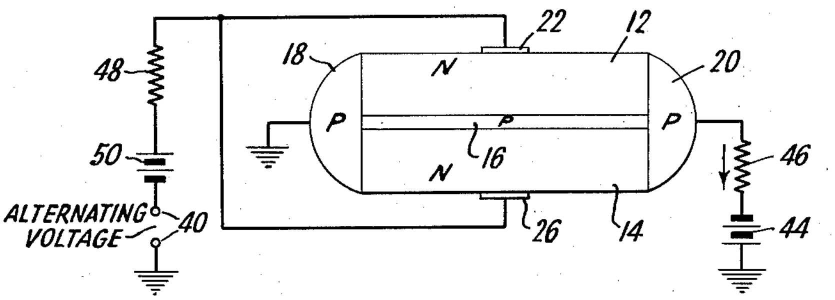
Fig. 2 shows a circuit arrangement incorportaing the transistor of Fig. 1.

Fig. 2 shows a circuit arrangement incorporating the field effect transistor of Fig. 1. In the arrangement shown, the bicrystal is formed from germanium having a resistivity of 1.5 ohm-centimeters, the crystals 12 and 14 have N type conductivity, and the grain boundary 16 has P type conductivity. The first and second rectifying connections 18 and 20 are P–N junctions (formed by indium alloyed contacts).

In Fig. 2, a series circuit of battery 44 and resistor 46 is connected between the first and second rectifying connections 18 and 20. The third and fourth ohmic connections 22 and 26 are connected in parallel to one end of the resistor 48, the other end of the resistor 48 is connected through battery 50 to one of terminals 40, the other terminal 40 being connected to battery 44. With the battery polarities indicated, in the absence of battery 50, connection 18 would be forward biased with respect to the crystal bulk, while connection 20 would be reverse biased. However, the insertion of battery 50 reverses the bias of connection 18. Hence, both connections 18 and 20 are reverse biased with respect to the crystal bulk.

The transistor of Fig. 2 was immersed in liquid nitrogen at a temperature of about 78° Kelvin.

Figure 3:
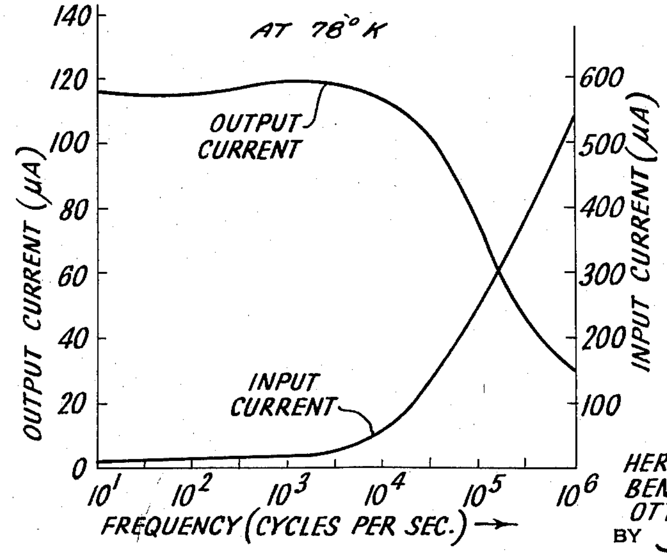
Figs. 3–5 are graphs illustrating certain electrical characteristics of our field effect transistor as utilized in the circuit arrangement of Fig. 2.

With resistors 46 and 48 having values of 20,000 ohms and 1,000 ohms respectively, and batteries 44 and 50 having voltage values of 45 volts and 2 volts respectively, an alternating voltage of 1 volt was applied between terminals 40. The frequency of the alternating voltage was varied in steps over a range of 10 to 1,000,000 cycles per second, the current through resistor 46 (the output current) and the current through resistor 48 (the input current) being measured at each step. The resultant current-frequency characteristics are shown in Fig. 3.

Figure 4:
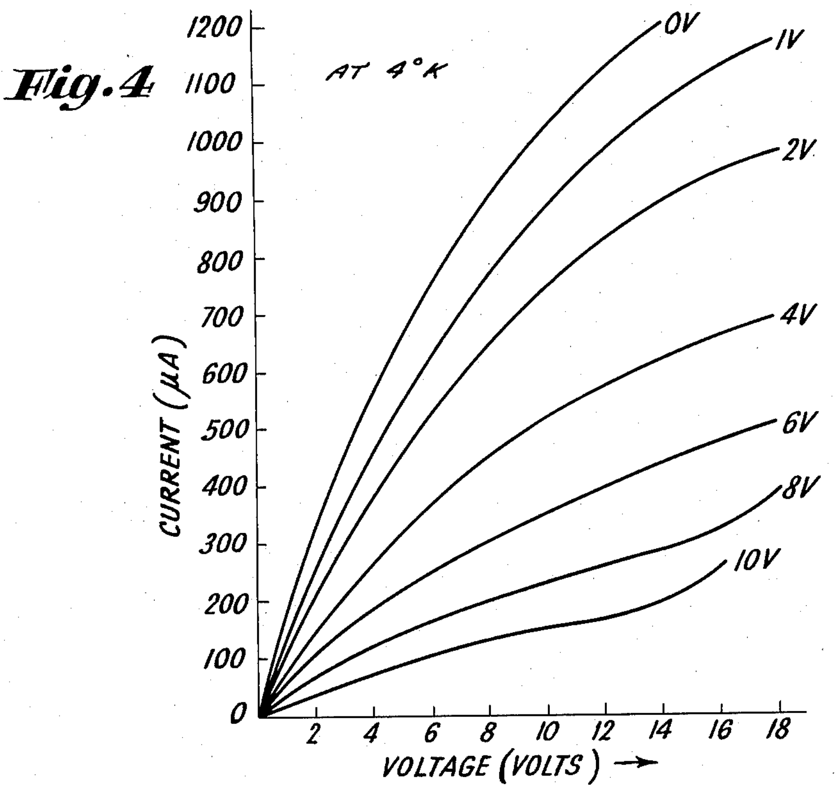

The transistor of Fig. 2 was then immersed in liquid helium at a temperature of about 4° Kelvin. Resistors 46 and 48 and terminals 40 were short-circuited. The voltage of battery 50 was set at one fixed value as, for example, 2 volts. The voltage of battery 44 was then varied in steps from 0 to 18 volts, and the output current was measured at each step. This process was then repeated for different fixed voltage values of battery 44 to produce the family of current-voltage curves as shown in Fig. 4.

Figure 5:
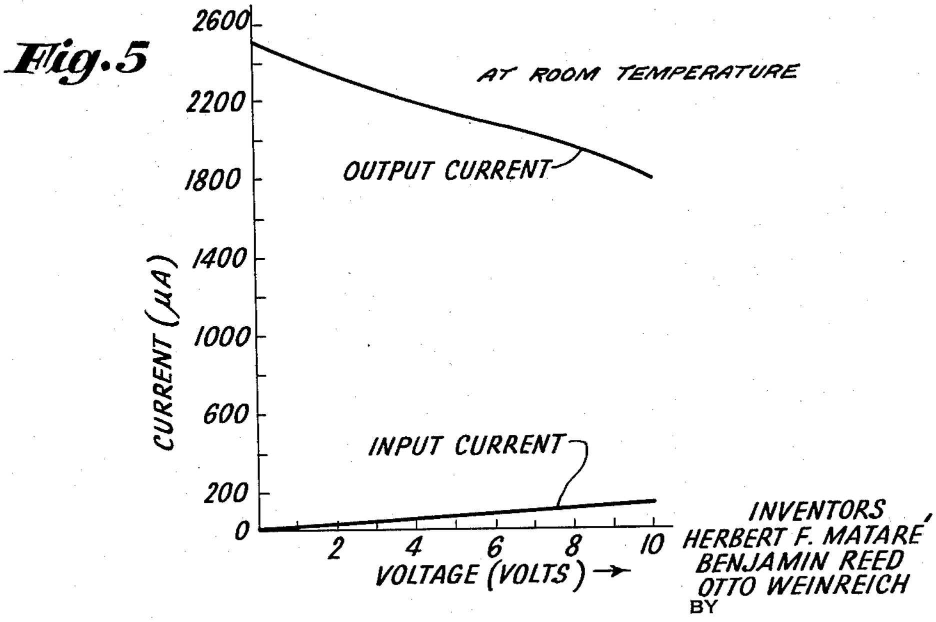

The transistor of Fig. 2 was then maintained at room temperature. Resistors 46 and 48 and terminals 40 were short circuited. For a fixed voltage of battery 44, the voltage of battery 50 was varied in steps from 0 to 10 volts, and both input and output currents were measured at each step. The resultant current-voltage characteristics are shown in Fig. 5.

The circuit of Fig. 2 utilizes two non-rectifying or ohmic contacts 22 and 26. If desired, one of these contacts 22 and 26 need not be used. In this event, however, the transistor action, while still present, is less pronounced.

What is claimed is:

1. A transistor comprising a semiconductor bicrystal consisting of two joined semiconductor crystals of one conductivity type and a grain boundary interface of opposite conductivity common to both crystals and extending through said bicrystal between opposite ends thereof; first and second connections secured to corresponding ends of the bicrystal, each of said first and second connections being in rectifying contact with said semi-conductor crystals and in ohmic contact with said interface; and a third connection secured to an exposed crystal surface at a point intermediate the ends of the bicrystal, said third connection being in ohmic contact with said semiconductor crystals.

2. A transistor comprising a semiconductor bicrystal consisting of two joined semiconductor crystals of one conductivity type and a grain boundary interface of opposite conductivity common to both crystals and extending through said bicrystal between opposite ends thereof; first and second connections secured to corresponding ends of the bicrystal, each of said first and second connections being in rectifying contact with said semiconductor crystals and in ohmic contact with said interface; and third and fourth connections secured to different exposed surfaces of the bicrystal at separate points intermediate the ends of the bicrystal, said third and fourth connections being in ohmic contact with said semiconductor crystals.

3. A circuit comprising a transistor including a semiconductor bicrystal consisting of two joined semiconductor crystals of one conductivity type and a grain boundary interface of opposite conductivity common to both crystals and extending through said bicrystal between opposite ends thereof; first and second connections secured to corresponding ends of the bicrystal, each of said first and second connections being in rectifying contact with said semiconductor crystals and in ohmic contact with said interface; a third connection secured to an exposed crystal surface at a point intermediate the ends of the bicrystal, said third connection being in ohmic contact with one of said semiconductor crystals, means to bias both of said first and second connections in the reverse direction whereby an output current flows along said interface between said first and second connections; and means to apply a variable voltage between said first and third connections whereby said output current is modulated in accordance with the variations of said voltage.

4. A circuit comprising a transistor including a semiconductor bicrystal consisting of two joined semiconductor crystals of one conductivity type and a grain boundary interface of opposite conductivity common to both crystals and extending through said bicrystal between opposite ends thereof; first and second connections secured to corresponding ends of the bicrystal, each of said first and second connections being in rectifying contact with said semiconductor crystals and in ohmic contact with said interface; third and fourth connections secured to different exposed surfaces of the bicrystal at separate points intermediate the ends of the bicrystal, said third and fourth connections being in ohmic contact with said semiconductor crystals, said third and fourth connections being connected together in parallel; means to bias both of said first and second connections in parallel whereby an output current flows along said interface between said first and second connections; and means to apply a variable voltage between the first connection and the paralleled third and fourth connections whereby the output current is modulated in accordance with the variations of said voltage.

5. A transistor comprising a semiconductor bicrystal consisting of two joined semiconductor crystals of one conductivity type and a grain boundary interface of opposite conductivity common to both crystals and extending through said bicrystal between opposite ends thereof; first and second alloyed contacts secured to corresponding ends of the bicrystal, each of said first and second contacts forming a P–N junction with said semiconductor crystals and being in ohmic contact with said interface; and a third ohmic contact secured to an exposed crystal surface at a point intermediate the ends of the bicrystal.

6. A transistor comprising a germanium bicrystal consisting of two joined semiconductor crystals of N conductivity type and a grain boundary interface of opposite conductivity common to both crystals and extending through said bicrystal between opposite ends thereof; first and second indium alloyed contacts secured to corresponding ends of the bicrystal, each of said first and second contacts forming a P–N junction with said semiconductor crystals and being in ohmic contact with said interface; and a third ohmic contact secured to an exposed crystal surface at a point intermediate the ends of the bicrystal.

References Cited in the file of this patent

UNITED STATES PATENTS

| | | |
|---|---|---|
| 2,744,960 | Shockley | May 8, 1956 |
| 2,754,431 | Johnson | July 10, 1956 |
| 2,756,285 | Shockley | July 24, 1956 |
| 2,778,956 | Dacey et al. | Jan. 22, 1957 |
| 2,869,055 | Noyce | Jan. 13, 1959 |